United States Patent
Seshadri et al.

(10) Patent No.: US 12,002,856 B2
(45) Date of Patent: Jun. 4, 2024

(54) VERTICAL FIELD EFFECT TRANSISTOR WITH CROSSLINK FIN ARRANGEMENT

(71) Applicant: International Business Machines Corporation, Armonk, NY (US)

(72) Inventors: Indira Seshadri, Niskayuna, NY (US); Ruilong Xie, Niskayuna, NY (US); Chen Zhang, Guilderland, NY (US); Ekmini Anuja De Silva, Slingerlands, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 18/179,556

(22) Filed: Mar. 7, 2023

(65) Prior Publication Data

US 2023/0207632 A1    Jun. 29, 2023

Related U.S. Application Data

(62) Division of application No. 17/125,850, filed on Dec. 17, 2020, now Pat. No. 11,621,326.

(51) Int. Cl.
| | |
|---|---|
| H01L 29/10 | (2006.01) |
| H01L 21/308 | (2006.01) |
| H01L 29/78 | (2006.01) |

(52) U.S. Cl.
CPC ...... H01L 29/1037 (2013.01); H01L 21/3081 (2013.01); H01L 21/3086 (2013.01); H01L 29/7827 (2013.01)

(58) Field of Classification Search
CPC ............. H01L 29/1037; H01L 21/3081; H01L 21/3086; H01L 29/7827

(Continued)

(56) References Cited

U.S. PATENT DOCUMENTS

| | | |
|---|---|---|
| 8,956,932 B2 | 2/2015 | Cheng |
| 9,391,073 B2 | 7/2016 | Yin |

(Continued)

FOREIGN PATENT DOCUMENTS

WO    2022128393 A1    6/2022

OTHER PUBLICATIONS

IBM: List of IBM Patents or Patent Applications Treated as Related. Filed Herewith. 2 pages.

(Continued)

*Primary Examiner* — Caleen O Sullivan
(74) *Attorney, Agent, or Firm* — Kimberly Zillig

(57) ABSTRACT

A method of forming a semiconductor structure includes forming a first array of mandrels on a hardmask layer disposed on an uppermost surface of a semiconductor substrate. First sidewall image transfer spacers are formed on opposing longitudinal sidewalls of each mandrel in the first array of mandrels. A second array of mandrels is formed on the hardmask layer. Each mandrel in the second array of mandrels is laterally separated from each mandrel in the first array of mandrels by the first sidewall image transfer spacers. Second sidewall image transfer spacers are formed on opposing transversal sidewalls of the first array of mandrels and the second array of mandrels. Portions of the second sidewall image transfer spacers are selectively removed to define a crosslink fin pattern to be transferred to the semiconductor substrate.

25 Claims, 11 Drawing Sheets

(58) Field of Classification Search
USPC .......................................................... 257/618
See application file for complete search history.

(56) References Cited

U.S. PATENT DOCUMENTS

| | | |
|---|---|---|
| 9,496,259 B2 | 11/2016 | Chien |
| 10,224,249 B2 | 3/2019 | Anderson |
| 10,340,364 B2 | 7/2019 | Zhang |
| 10,361,200 B1 | 7/2019 | Xu |
| 10,381,459 B2 | 8/2019 | Xie |
| 10,418,484 B1 | 9/2019 | Xie |
| 10,566,432 B2 | 2/2020 | Lin |
| 11,621,326 B2 * | 4/2023 | Seshadri ............. H01L 29/0657 257/618 |
| 2019/0051563 A1 | 2/2019 | Park |
| 2019/0148516 A1 | 5/2019 | Zhang |
| 2019/0198502 A1 | 6/2019 | Huang |
| 2022/0199776 A1 | 6/2022 | Seshadri |

OTHER PUBLICATIONS

International Search Report and Written Opinion, International Application No. PCT/EP2021/083050, Mailed Feb. 22, 2022, 12 pages.

* cited by examiner

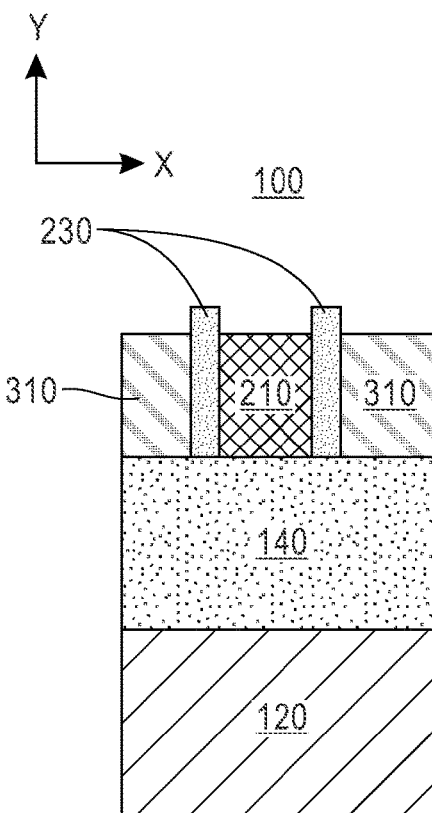
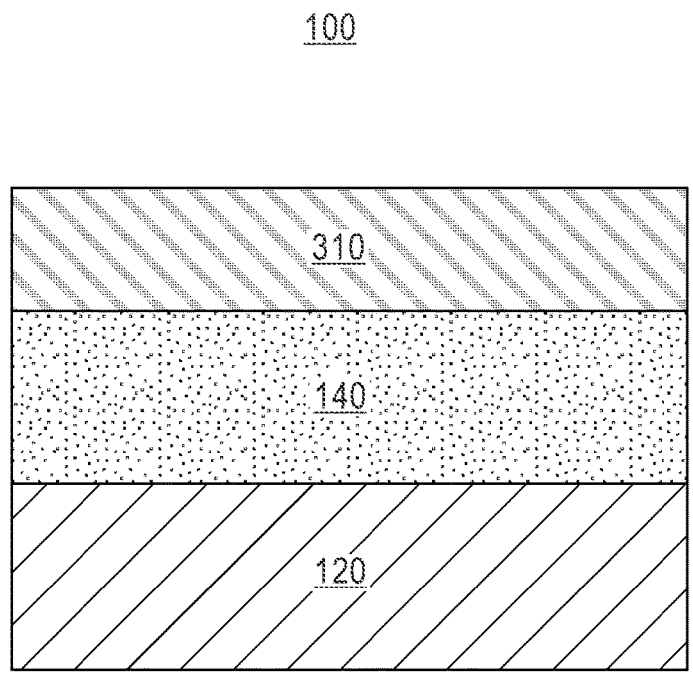
FIG. 4A  FIG. 4B
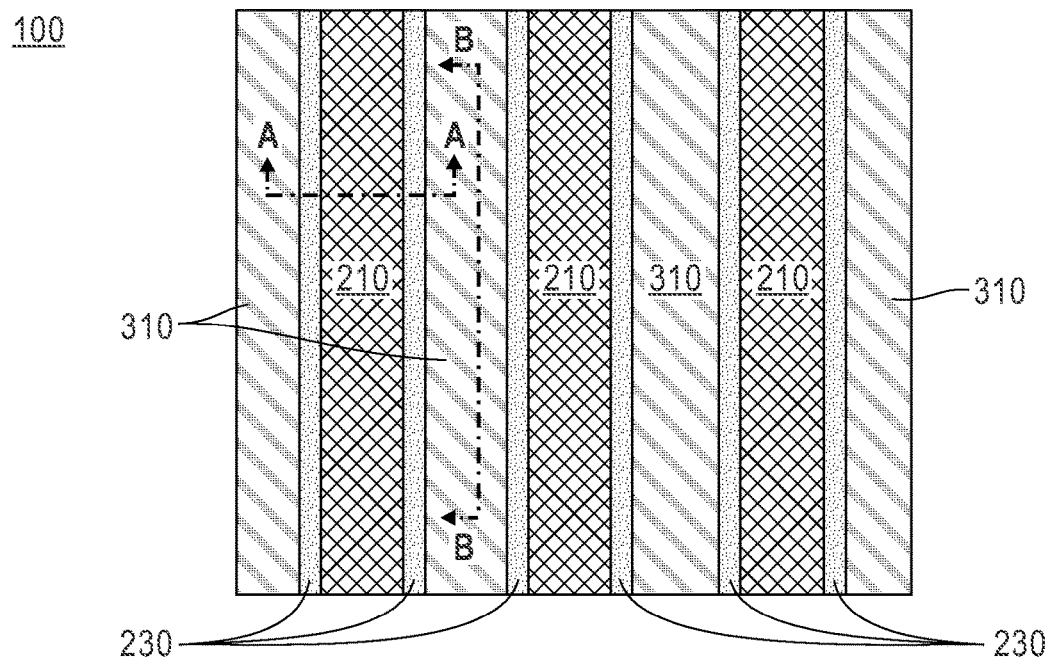
FIG. 4C

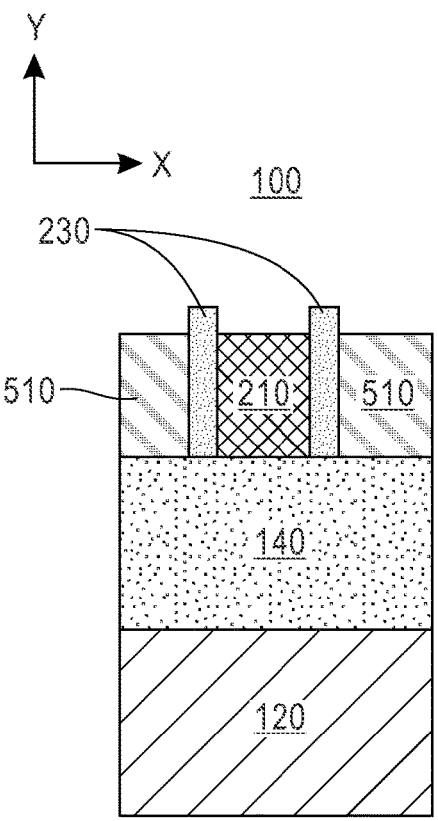
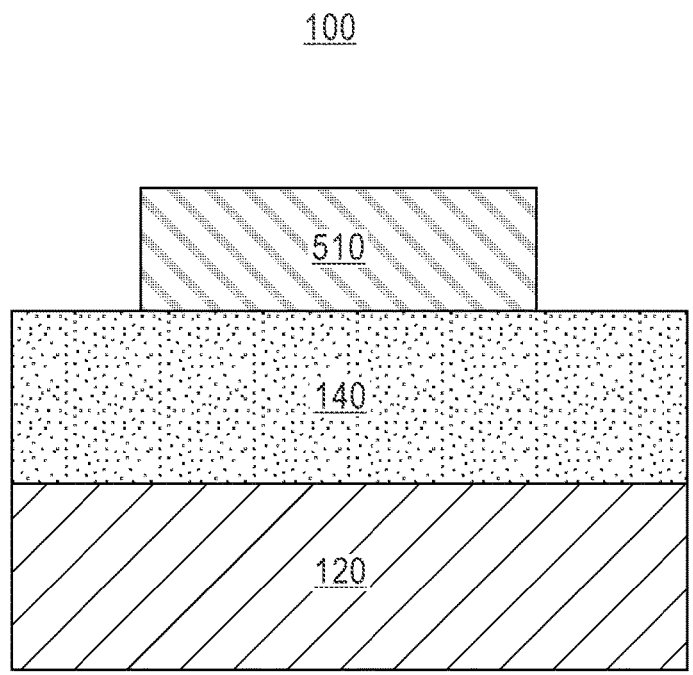
FIG. 5A  FIG. 5B
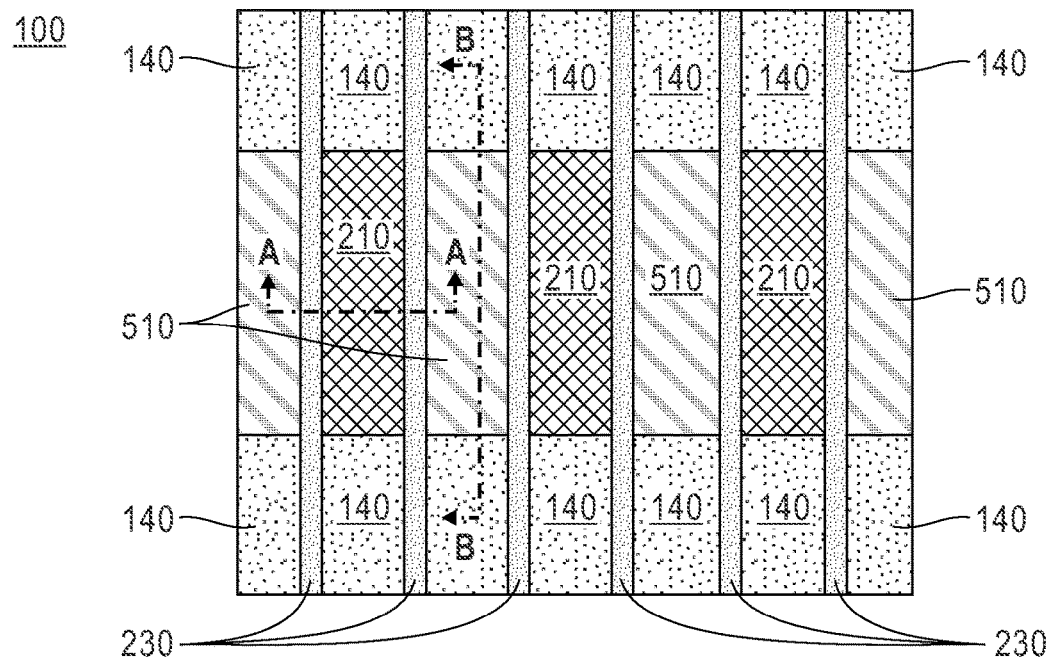
FIG. 5C

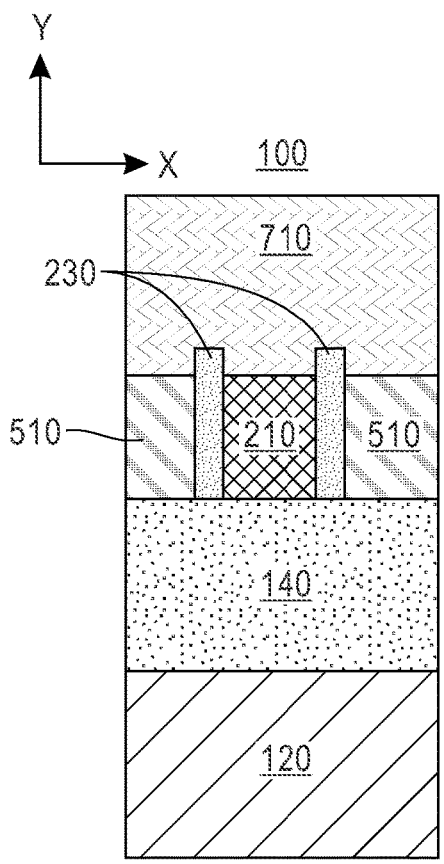
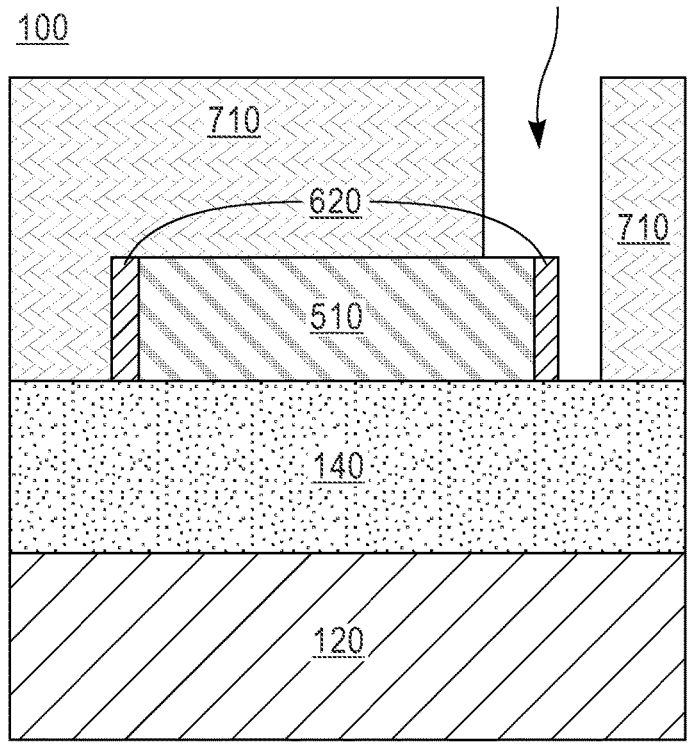
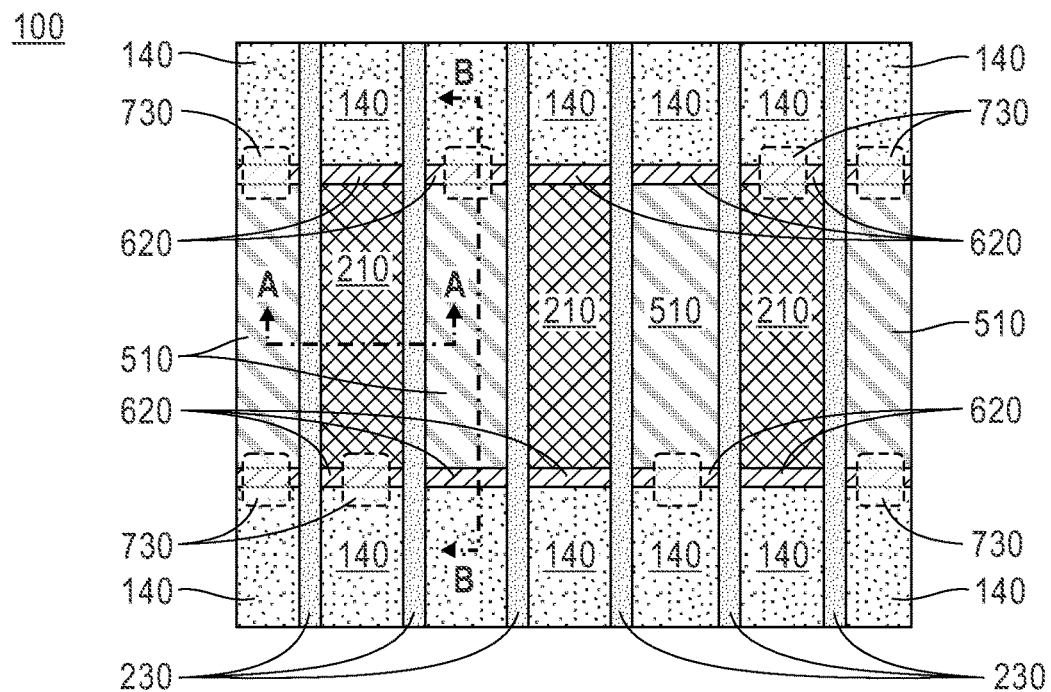
FIG. 7A
FIG. 7B
FIG. 7C

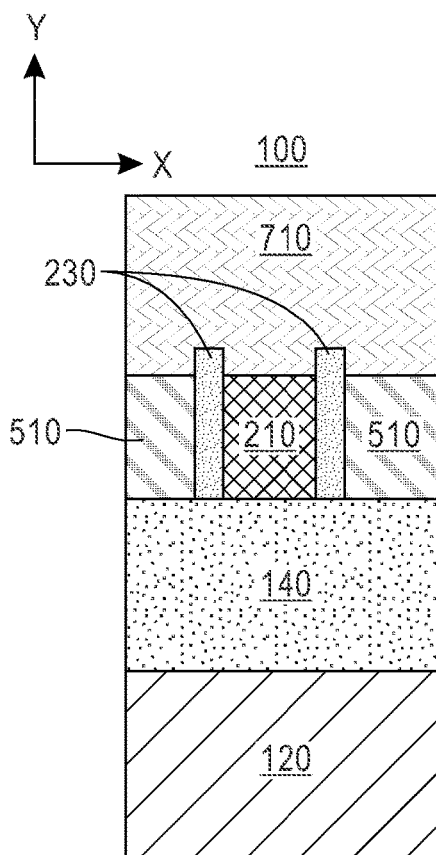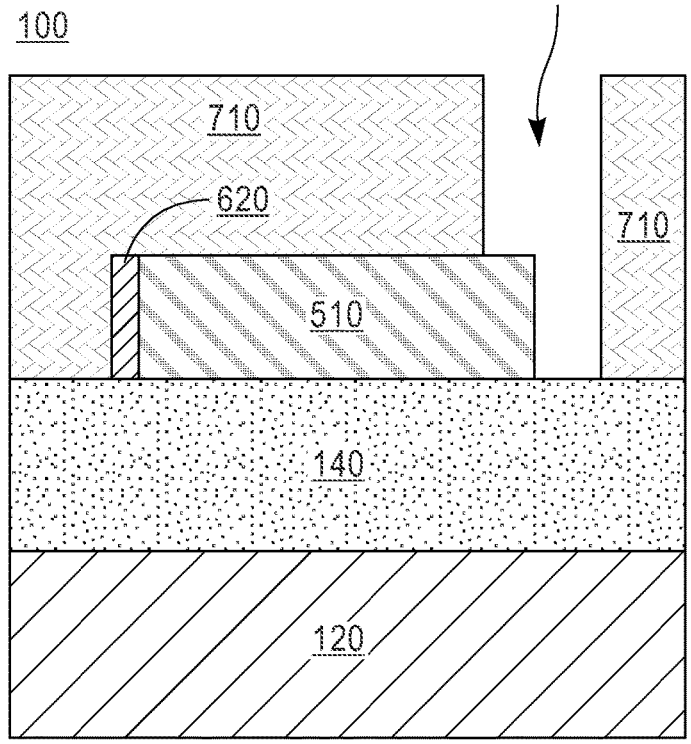
FIG. 8A    FIG. 8B
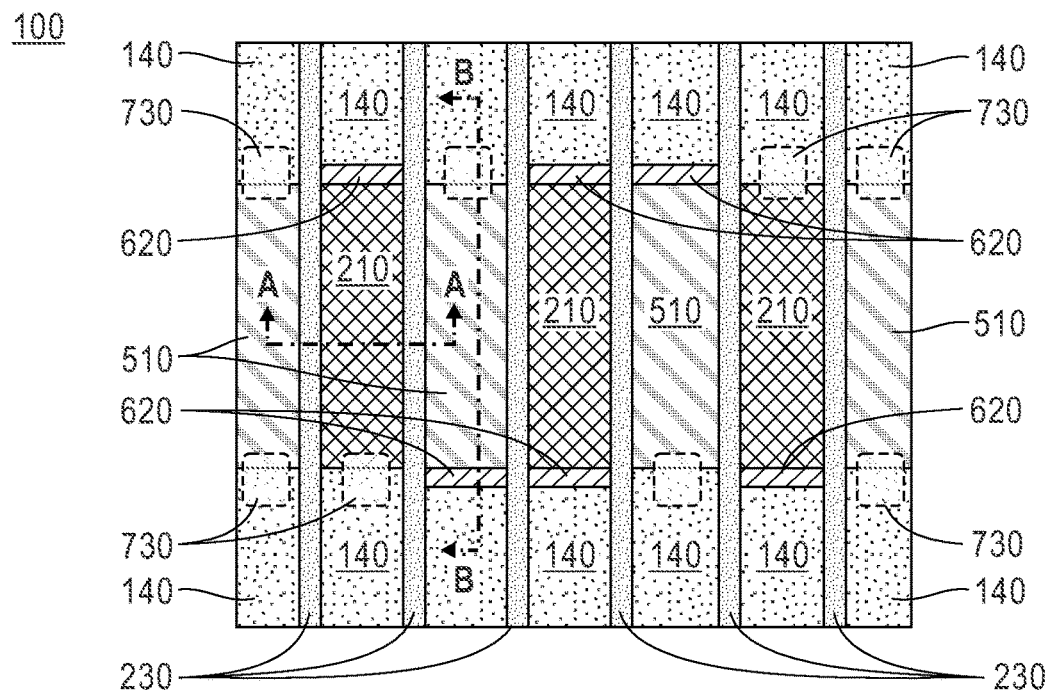
FIG. 8C

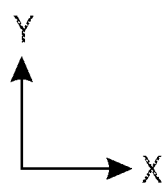
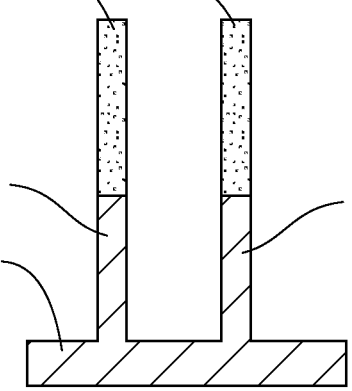
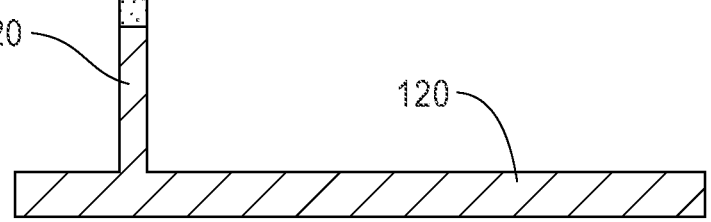
FIG. 11A          FIG. 11B
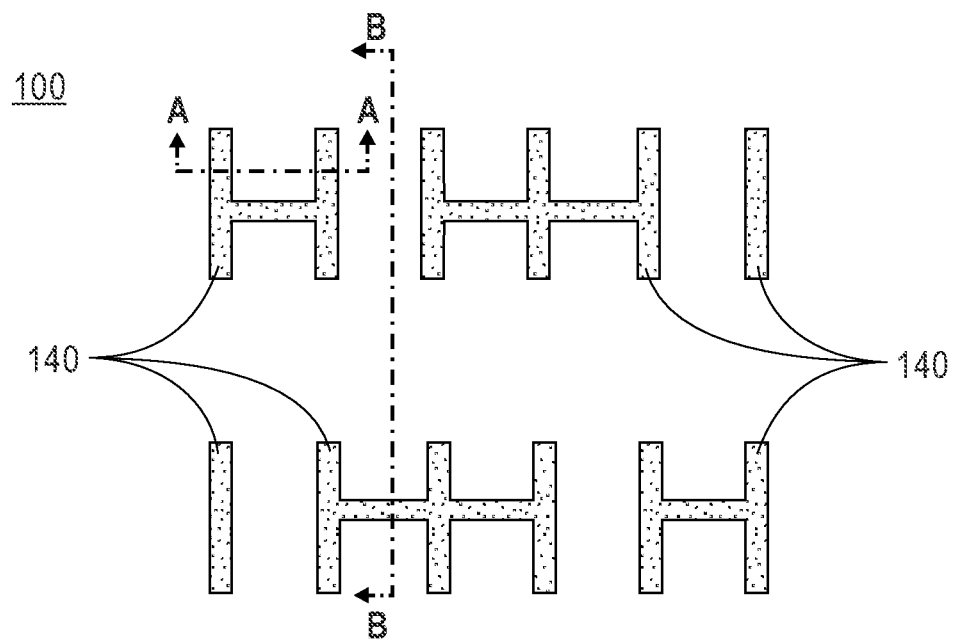
FIG. 11C

VERTICAL FIELD EFFECT TRANSISTOR WITH CROSSLINK FIN ARRANGEMENT

BACKGROUND

The present invention generally relates to the field of semiconductor devices, and more particularly to fabricating crosslink fin structures in vertical field-effect transistors (VFETs).

VFETs have been pursued as a potential device option for scaling complementary metal-oxide semiconductors (CMOS) to the 5 nanometer (nm) node and beyond. As opposed to planar CMOS devices, VFETs are oriented vertically with a vertical fin or nanowire that extends upward from the substrate. The fin or nanowire forms the channel region of the transistor. A source region and a drain region are situated in electrical contact with the top and bottom ends of the channel region, while the gate is disposed on one or more of the fin or nanowire sidewalls. Thus, in VFETs the direction of the current flow between the source and drain regions is normal to the main surface of the substrate.

Advantages of VFETs architecture include improved electrostatics and the ability to increase the amount of effective width ($W_{eff}$) available in a given device footprint. Continued scaling of fin width and fin pitch may present numerous challenges due to a combination of quantum effects, patterning process realities and contact architecture limitations. To improve $W_{eff}$ without compromising area scaling, fin structures with different shapes have been considered. C-shaped, Pi-shaped, and U-shaped fin structures have been implemented for improving $W_{eff}$. However, their design is not flexible and high parasitic capacitance have been observed between bottom source/drain contacts (CR) and gate.

SUMMARY

Therefore, there is a need for improved designs and techniques for fabricating VFET devices having crosslink fin structures that provide a flexible design while improving $W_{eff}$.

According to an embodiment of the present disclosure, a method of forming a semiconductor structure includes forming a first array of mandrels on a hardmask layer disposed on an uppermost surface of a semiconductor substrate, forming first sidewall image transfer spacers on opposing longitudinal sidewalls of each mandrel in the first array of mandrels, forming a second array of mandrels on the hardmask layer, each mandrel in the second array of mandrels being laterally separated from each mandrel in the first array of mandrels by the first sidewall image transfer spacers, forming second sidewall image transfer spacers on opposing transversal sidewalls of the first array of mandrels and the second array of mandrels, and selectively removing portions of the second sidewall image transfer spacers to define a crosslink fin pattern.

According to another embodiment of the present disclosure, a method of forming a semiconductor structure includes patterning a plurality of fin structures on an uppermost surface of a semiconductor substrate, each fin structure of the plurality of fin structures including n first regions extending perpendicular to the uppermost surface of the semiconductor substrate and n−1 second regions extending between and connecting each of the n first regions and parallel to the uppermost surface of the semiconductor substrate, wherein n≥1.

According to yet another embodiment of the present disclosure, a method of forming a semiconductor structure includes forming a hardmask layer on an uppermost surface of a semiconductor substrate, and transferring a pattern to the hardmask layer to define a plurality of fin structures on the uppermost surface of the semiconductor substrate, the plurality of fins structures including one or more vertical regions extending in a direction perpendicular to the uppermost surface of the semiconductor substrate and parallel to one another, at least two vertical regions of the one or more vertical regions being connected by a horizontal region extending between the at least two vertical regions in a direction parallel to the uppermost surface of the semiconductor substrate.

BRIEF DESCRIPTION OF THE DRAWINGS

The following detailed description, given by way of example and not intended to limit the invention solely thereto, will best be appreciated in conjunction with the accompanying drawings, in which:

FIG. 4A is a cross-sectional view of the semiconductor structure taken along line A-A after recessing the second semiconductor material, according to an embodiment of the present disclosure;

FIG. 4B is a lateral view of the semiconductor structure taken along a line B-B;

FIG. 4C is a top-down view of the semiconductor structure;

FIG. 5A is a cross-sectional view of the semiconductor structure taken along line A-A after patterning of the second semiconductor material, according to an embodiment of the present disclosure;

FIG. 5B is a lateral view of the semiconductor structure taken along line B-B;

FIG. 5C is a top-down view of the semiconductor structure;

FIG. 7A is a cross-sectional view of the semiconductor structure taken along A-A after forming an organic planarization layer and via openings, according to an embodiment of the present disclosure;

FIG. 7B is a lateral view of the semiconductor structure taken along line B-B;

FIG. 7C is a top-down view of the semiconductor structure;

FIG. 8A is a cross-sectional view of the semiconductor structure taken along line A-A after selectively removing portions of the second sidewall image transfer spacers, according to an embodiment of the present disclosure;

FIG. 8B is a lateral view of the semiconductor structure taken along line B-B;

FIG. 8C is a top-down view of the semiconductor structure;

FIG. 11A is a cross-sectional view of the semiconductor structure taken along A-A after forming a plurality of fin structures, according to an embodiment of the present disclosure;

FIG. 11B is a lateral view of the semiconductor structure taken along line B-B; and FIG. 11C is a top-down view of the semiconductor structure.

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Figure 1A:
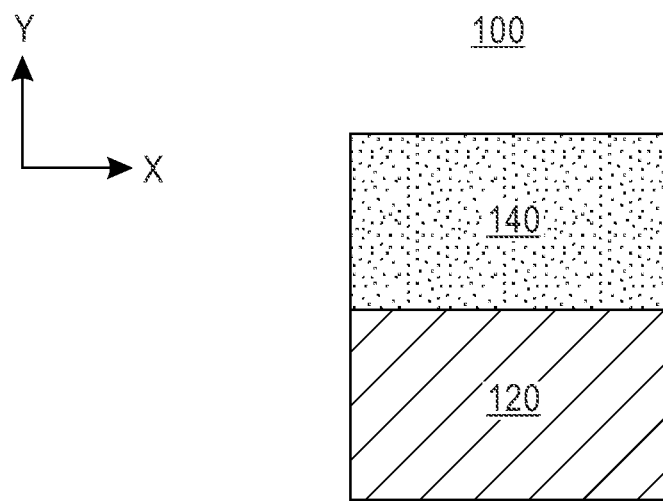
FIG. 1A is a cross-sectional view of a semiconductor structure taken along a line A-A at an initial step during a fin patterning process, according to an embodiment of the present disclosure.

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. In the description, details of well-known features and techniques may be omitted to avoid unnecessarily obscuring the presented embodiments.

For purposes of the description hereinafter, terms such as "upper", "lower", "right", "left", "vertical", "horizontal", "top", "bottom", and derivatives thereof shall relate to the disclosed structures and methods, as oriented in the drawing figures. Terms such as "above", "overlying", "atop", "on top", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

Non-planar transistor device architectures such as VFETs, employ semiconductor fins and side-gates that can be contacted outside the active region, resulting in increased device density over lateral devices. In VFETs the source to drain current flows in a direction that is perpendicular to a major surface of the substrate. For example, in a known VFET configuration a major substrate surface is horizontal and a vertical fin extends upward from the substrate surface. The fin forms the channel region of the transistor. A source/drain region is situated in electrical contact with the top and bottom ends of the channel region (i.e., top source/drain region and bottom source/drain region), while a gate is disposed on one or more of the fin sidewalls.

As previously mentioned, VFETs architecture offers advantages over planar devices including improved electrostatics and the ability to increase the amount of effective width ($W_{eff}$) available in a given device footprint. Continued scaling of fin width and fin pitch may present numerous challenges to VFET fabrication due to a combination of quantum effects, patterning process realities and contact architecture limitations. To improve $W_{eff}$ without compromising area scaling, fin structures with different shapes have been considered. C-shaped, Pi-shaped, and U-shaped fin structures have been implemented for improving $W_{eff}$. However, their design is not flexible and high parasitic capacitance have been observed between bottom source/drain contacts (CR) and gate.

Reduced capacitance have been observed in devices with H-shaped 2D fin structures, but their design is not flexible for VFET devices including only one fin structure (fins=1) or having more than three fin structures (fins>3). Thus, embodiments of the present disclosure provide a VFET device, and a method of making the same, having a crosslink fin arrangement for devices having a number of fins greater than 1 (fins>1) and a single fin arrangement for single fin devices (fins=1). The proposed crosslink configuration may reduce device parasitic capacitance while improving $W_{eff}$ and providing a flexible device design.

As used herein, the term crosslink may refer to a shape having two or more vertical segments (or regions) connected or linked by a horizontal segment.

Embodiments of the present disclosure provide a semiconductor structure including a combination of first vertical fin structures extending perpendicularly from a semiconductor substrate having a crosslink architecture and second vertical fin structures extending perpendicularly from the semiconductor substrate having a single fin architecture. Embodiments of the present disclosure may allow for the simultaneous fabrication of crosslink and single fin structures having desirable parameters (e.g., thickness, width, etc.) that allow for an increased $W_{\mathit{eff}}$ and reduced parasitic capacitance, which may in turn improve overall performance of the VFET device. Embodiments by which the VFET device with crosslink fin arrangement can be formed is described in detailed below by referring to the accompanying drawings in FIGS. 1A-11C.

Figure 1B:
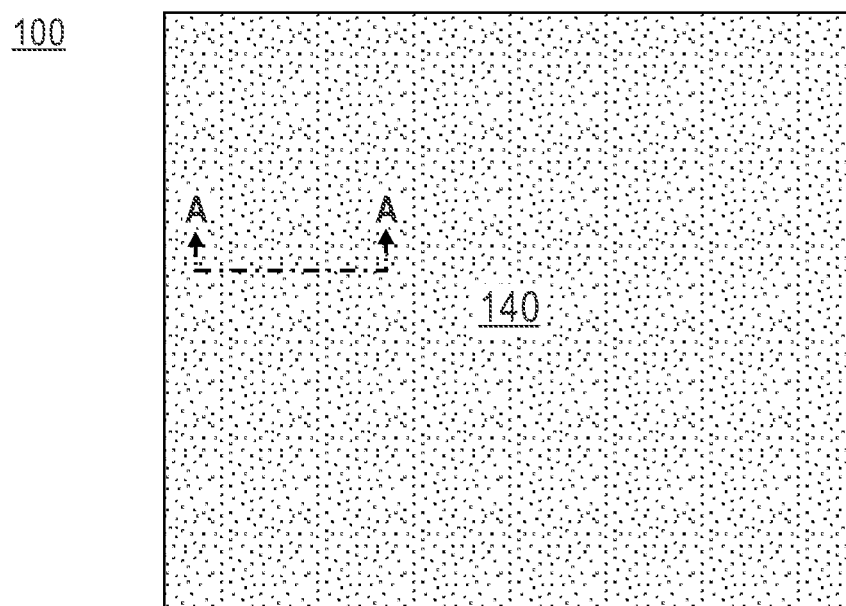
FIG. 1B is a top-down view of the semiconductor structure.

Referring now to FIG. 1A, a cross-sectional view of a semiconductor structure 100 taken along line A-A at an initial step during a fin patterning process is shown, according to an embodiment of the present disclosure. In this embodiment, FIG. 1B is a top-down view of the semiconductor structure.

Known semiconductor fabrication operations have been used to form the semiconductor structure 100 having a semiconductor substrate 120 and a hardmask layer 140 above the semiconductor substrate 120. It should be noted that the various elements that form the semiconductor structure 100 extend along a first axis (e.g., X-axis) to define width dimensions, and extend along a second axis (e.g., Y-axis) perpendicular to the X-axis to define height (or thickness) dimensions. Although not specifically depicted, the various elements that form the semiconductor structure 100 also extend along a third axis (e.g., Z-axis) perpendicular to the first axis and the second axis to define depth dimensions.

The semiconductor substrate 120 can be any suitable substrate material, such as, for example, monocrystalline silicon (Si), silicon-germanium (SiGe), silicon carbide (SiC), III-V compound semiconductor, II-VI compound semiconductor, or semiconductor-on-insulator (SOI). In some embodiments, the semiconductor substrate 120 includes a buried oxide layer (not depicted). Typically the semiconductor substrate 120 may be about several hundred microns thick. For example, the semiconductor substrate 120 may include a thickness ranging from approximately 0.5 μm to approximately 75 μm.

The hardmask layer 140 can be a dielectric material such as, for example, silicon dioxide, silicon nitride, silicon carbide, or a combination of such materials forming a multiple stack hardmask. The hardmask layer 140 can be deposited by any suitable deposition method known in the art. As known by those skilled in the art, the hardmask layer 140 may also be referred to as a "fin hardmask". A thickness of the hardmask layer 140 may vary from approximately 10 nm to approximately 200 nm and ranges therebetween, although a thickness less than 10 nm and greater than 200 nm may be acceptable.

Figure 2A:
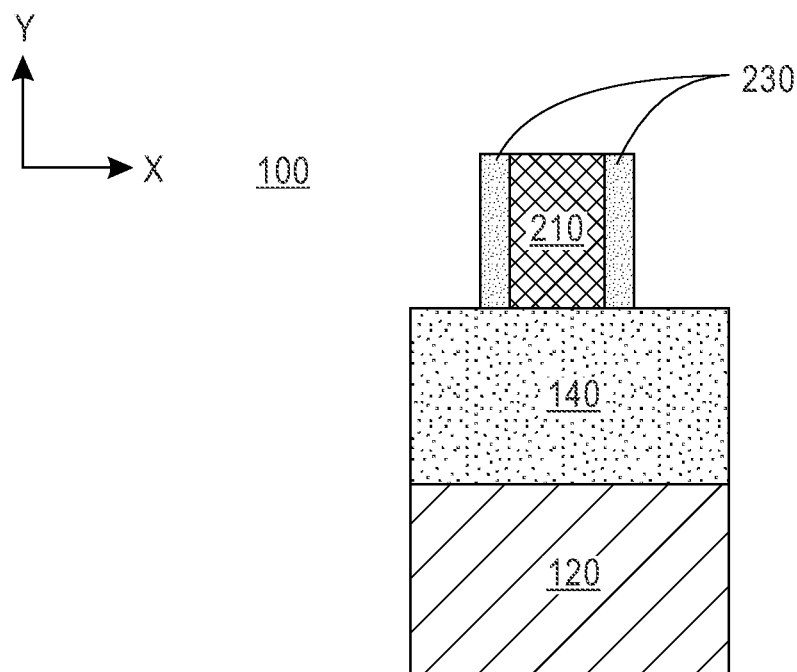
FIG. 2A is a cross-sectional view of the semiconductor structure taken along line A-A after forming a first array of mandrels and first sidewall image transfer spacers, according to an embodiment of the present disclosure.
Figure 2B:
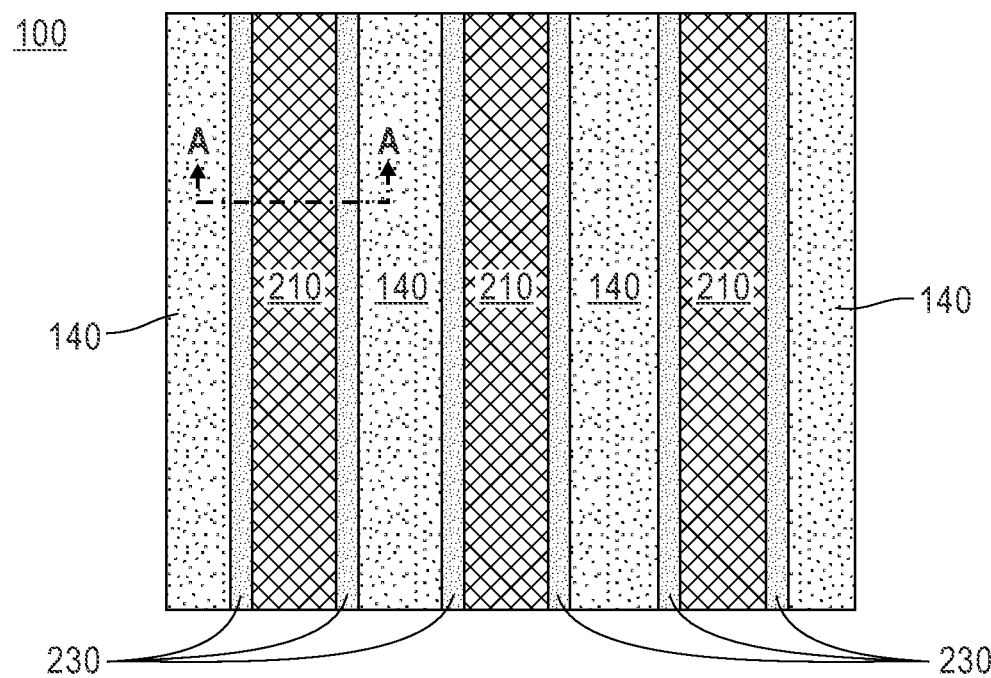
FIG. 2B is a top-down view of the semiconductor structure.

Referring now to FIG. 2A, a cross-sectional view of the semiconductor structure 100 taken along line A-A after forming a first array of mandrels (hereinafter "first mandrels") 210 and first sidewall image transfer (SIT) spacers 230 is shown, according to an embodiment of the present disclosure. In this embodiment, FIG. 2B is a top-down view of the semiconductor structure 100.

In this embodiment, the first mandrels 210 are formed above the hardmask layer 140. For illustration purposes only, without intent of limitation, a limited number of mandrel structures (i.e., first mandrels 210) are depicted in the figure, those skilled in the art may know that any number of mandrel structures can be formed in the semiconductor structure 100 to satisfy design requirements.

The first mandrels 210 may be made from any of several known semiconductor materials such as, for example, polycrystalline silicon (Si), polycrystalline silicon-germanium (SiGe), and the like. A first semiconductor material (not shown) can be deposited and then patterned to form the first mandrels 210. The first semiconductor material forming the first mandrels 210 can be deposited by any suitable technique known in the art, for example, by chemical vapor deposition (CVD), atomic layer deposition (ALD), physical vapor deposition (PVD), or plasma enhanced chemical vapor deposition (PECVD). However, it should be noted that other materials may also be used to form the first mandrels 210 so long as there is an etch selectivity with respect to subsequently formed sidewall spacers thereon. A shape of the first mandrels 210 may have nearly vertical etch slopes or nearly vertical contact angles.

The first semiconductor material is then lithographically patterned to form the first mandrels 210. As known by those skilled in the art, patterning of the first semiconductor material to form the first mandrels 210 involves exposing a photo-resist (not shown) and transferring the exposed pattern of the photo-resist to the first semiconductor material. After patterning, a width of the resulting first mandrels 210 may vary from approximately 10 nm to approximately 100 nm and ranges therebetween, although a width less than 10 nm and greater than 100 nm may be acceptable.

Subsequently, a layer of dielectric material (not shown) can be conformally deposited on the semiconductor structure 100. A directional etching process such as a reactive-ion-etching (RIE) can be conducted on the semiconductor structure 100 to remove portions of the dielectric material from top surfaces of the hardmask layer 140 and first mandrels 210. As illustrated in the figure, after the etching process a portion of the dielectric material remains along opposite sidewalls of the first mandrels 210 forming first SIT spacers 230.

Etching generally refers to the removal of a material from a substrate (or structures formed on the substrate), and is often performed with a mask in place so that material may selectively be removed from certain areas of the substrate, while leaving the material unaffected, in other areas of the substrate. There are generally two categories of etching, (i) wet etch and (ii) dry etch. Wet etch is performed with a solvent (such as an acid) which may be chosen for its ability to selectively dissolve a given material (such as oxide), while, leaving another material (such as polysilicon) relatively intact. This ability to selectively etch given materials is fundamental to many semiconductor fabrication processes. A wet etch will generally etch a homogeneous material (e.g., oxide) isotropically, but a wet etch may also etch single-crystal materials (e.g., silicon wafers) anisotropically. Dry etch may be performed using a plasma. Plasma systems can operate in several modes by adjusting the parameters of the plasma. Ordinary plasma etching produces energetic free radicals, neutrally charged, that react at the surface of the wafer. Since neutral particles attack the wafer from all angles, this process is isotropic. Ion milling, or sputter etching, bombards the wafer with energetic ions of noble gases which approach the wafer approximately from one direction, and therefore this process is highly anisotropic. RIE operates under conditions intermediate between sputter and plasma etching and may be used to produce deep, narrow features, such as shallow trench isolation (STI) trenches.

Furthermore, each of the first mandrels 210 and SIT spacers 230 include materials that allow the first mandrels 210 to be removed selective to the SIT spacers 230. The SIT spacers 230 will subsequently define a fin pattern which ultimately may be transferred into the underlying semiconductor substrate 120, as will be described in detail below.

Any suitable dielectric material can be used to form the first SIT spacers 230. For example, a suitable dielectric material for forming the SIT spacers 230 may include silicon dioxide ($SiO_2$), oxygen-doped silicon carbide (SiCO), or similar dielectric materials. As mentioned above, the dielectric material forming the first SIT spacers 230 should include a material that allows the first mandrels 210 to be selectively etched in order to avoid erosion of the first SIT spacers 230. The dielectric material forming the first SIT spacers 230 can be deposited using conformal deposition techniques such as, for example, ALD, or any other suitable deposition technique. According to an embodiment, the SIT spacers 230 may have width varying from approximately 5 nm to approximately 50 nm.

Figure 3A:
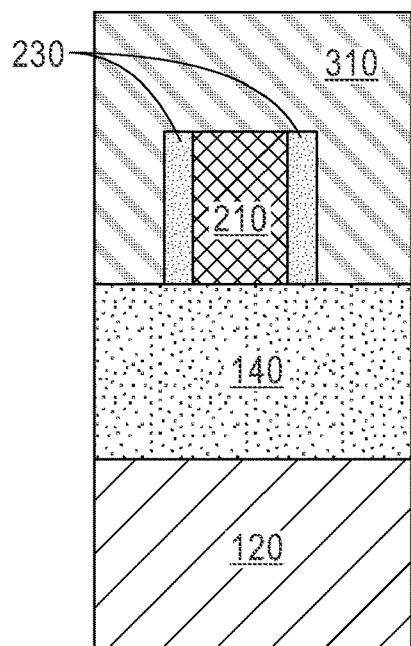
FIG. 3A is a cross-sectional view of the semiconductor structure after depositing a second semiconductor material, according to an embodiment of the present disclosure.
Figure 3B:
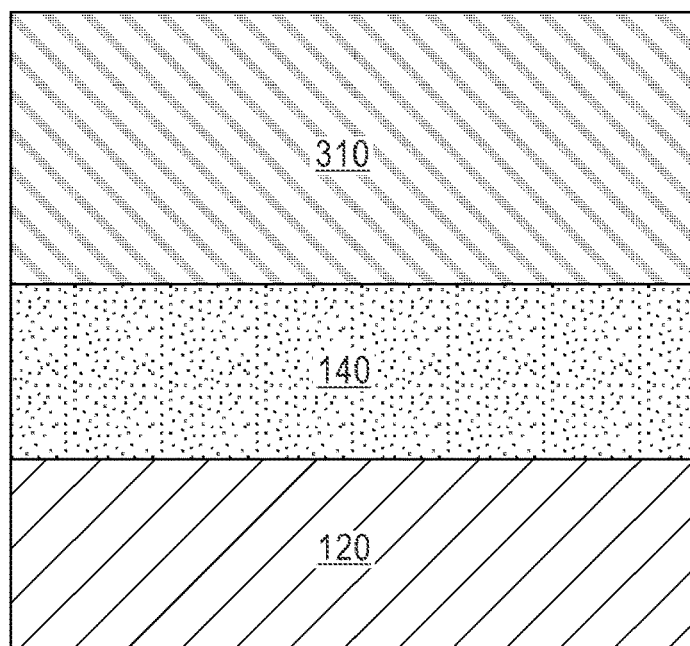
FIG. 3B is a lateral view of the semiconductor structure taken along the Y-plane.
Figure 3C:
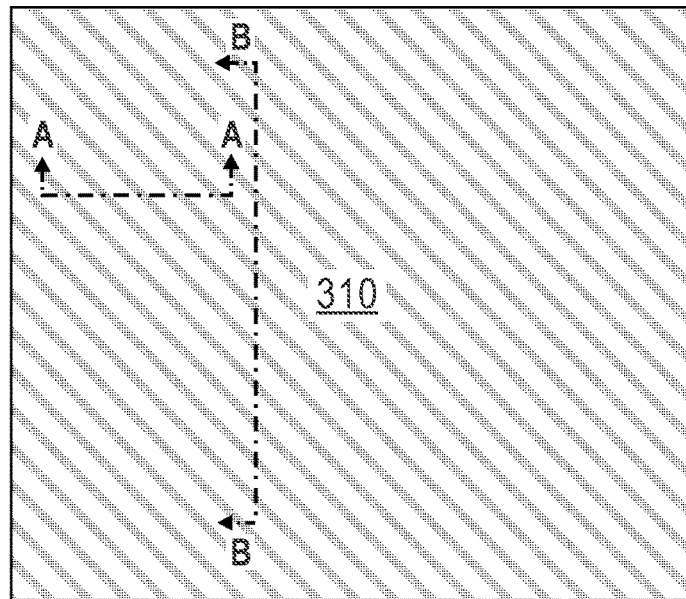
FIG. 3C is a top-down view of the semiconductor structure.

Referring now to FIG. 3A, a cross-sectional view of the semiconductor structure 100 after depositing a second semiconductor material 310 is shown, according to an embodiment of the present disclosure. In this embodiment, FIG. 3B is a lateral view of the semiconductor structure 100 taken along the Y-axis; and FIG. 3C is a top-down view of the semiconductor structure 100.

The second semiconductor material 310 may be made using analogous steps and the same or similar semiconductor materials as the first semiconductor material (not shown) forming the first mandrels 210. After deposition of the second semiconductor material 310, a planarization process, such as a chemical mechanical polishing (CMP), can be conducted on the semiconductor structure 100.

Referring now to FIG. 4A, a cross-sectional view of the semiconductor structure 100 taken along line A-A after recessing the second semiconductor material 310 is shown, according to an embodiment of the present disclosure. In this embodiment, FIG. 4B is a lateral view of the semiconductor structure 100 taken along line B-B, and FIG. 4C is a top-down view of the semiconductor structure 100.

In this embodiment, the second semiconductor material 310 and the first mandrels 210 are recessed to exposed top portions of the first SIT spacers 230, as can be appreciated in FIGS. 4A and 4C. Any suitable etching technique such as RIE, can be used to recess the second semiconductor material 310 and first mandrels 210.

Referring now to FIG. 5A, a cross-sectional view of the semiconductor structure 100 taken along line A-A after patterning of the second semiconductor material 310 (FIGS. 4A-4C) is shown, according to an embodiment of the present disclosure. In this embodiment, FIG. 5B is a lateral view of the semiconductor structure 100 taken along line B-B, and FIG. 5C is a top-down view of the semiconductor structure 100.

In this embodiment, a patterning process is conducted on the second semiconductor material 310 (FIGS. 4A-4C) to form a second array of mandrels (hereinafter "second mandrels") 510 on the semiconductor structure 100. As depicted in FIGS. 5A and 5C, the second mandrels 510 are formed on outer sidewalls of the first SIT spacers 230. Inner sidewalls of the first SIT spacers 230 are separated by the first mandrels 210.

Similar to the first mandrels 210, the process of patterning the second semiconductor material 310 (FIGS. 4A-4C) to form the second mandrels 510 consists of steps well-known in the art, which generally include forming a pattern on a photoresist layer (not shown) that is transferred to a patterned hardmask (not shown) and used to pattern the underlying semiconductor material 310 (FIGS. 4A-4C) via any suitable etching technique (e.g., RIE).

Figure 6A:
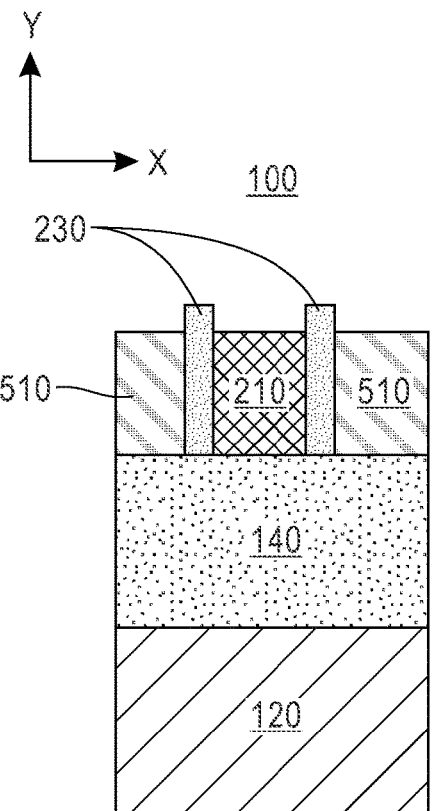
FIG. 6A is a cross-sectional view of the semiconductor structure taken along line A-A after forming second sidewall image transfer spacers, according to an embodiment of the present disclosure.
Figure 6B:
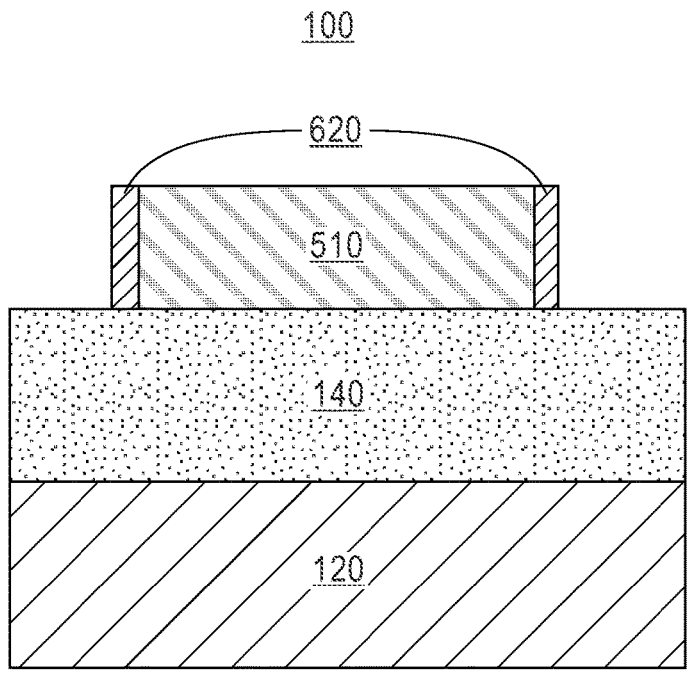
FIG. 6B is a lateral view of the semiconductor structure taken along line B-B.

Referring now to FIG. 6A, a cross-sectional view of the semiconductor structure 100 taken along line A-A after forming second SIT spacers 620 is shown, according to an embodiment of the present disclosure. In this embodiment, FIG. 6B is a lateral view of the semiconductor structure 100 taken along line B-B, and FIG. 6C is a top-down view of the semiconductor structure 100.

The second SIT spacers 620 are formed by selectively depositing a second spacer material over the first semiconductor mandrel material (e.g., Si or SiGe) forming the first SIT spacers 230. However, growth of the second spacer material does not occur over other materials in the semiconductor structure 100, e.g., the first SIT spacers 230. After selective growth of the second spacer material, a top portion of the second spacer material can be removed by an anisotropic RIE.

Figure 6C:
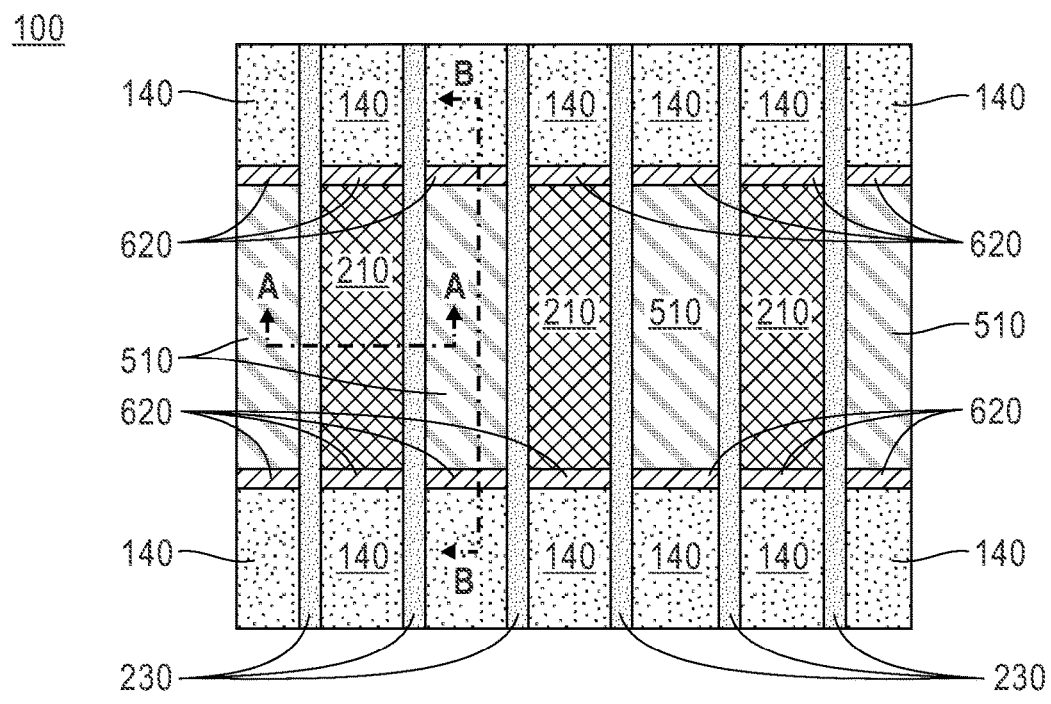
FIG. 6C is a top-down view of the semiconductor structure.

Portions of the second spacer material perpendicular to the hardmask layer 140 remain on opposing (lateral) sidewalls of the first mandrels 210, as depicted in FIG. 6C, and second mandrels 510, as depicted in FIGS. 6-B-6C. In this embodiment, the second spacer material forming the second SIT spacers 620 includes a material that is different from the first spacer material forming the first SIT spacers 230. For example, in an embodiment, the second spacer material forming the second SIT spacers 620 may include titanium (Ti). By forming the second SIT spacers 620 using a different spacer material than that used to form the first SIT spacers 230, unwanted regions of the second SIT spacers 620 for design purposes can be selectively removed without damaging the first SIT spacers 230 and neighboring (wanted) remaining regions of the second SIT spacers 620. As will be described in detail below, the selective removal of the second SIT spacers 620 allows to form a desired crosslink fin pattern than can be subsequently transferred to the semiconductor substrate 120.

As can be observed in FIG. 6C (i.e., top-down view of the semiconductor structure 100), the first SIT spacers 230 cover opposing sidewalls of the first mandrels 210 and second mandrels 510 longitudinally (y-direction) while the second SIT spacers 620 cover opposing sidewalls of the first mandrels 210 and second mandrels 510 transversally (x-direction). Stated differently, longitudinal and transversal surfaces of each of the first mandrels 210 and second mandrels 510 are enclosed by a set of first SIT spacers 230 (x-direction) and a set of second SIT spacers 620 (y-direction), respectively.

It should be apparent that a width of the first SIT spacers 230 and a width of the second SIT spacers 620 may be chosen to be the same as that of the desired width of the final fin shape (with any etch film erosion factored in). Thus, the first SIT spacers 230 and second SIT spacers are formed on vertical sidewalls of the first mandrels 210 and second mandrels 510 to determine a final pattern widths and tolerances of the components being formed in the semiconductor substrate 120.

Referring now to FIG. 7A, a cross-sectional view of the semiconductor structure 100 taken along A-A after forming an organic planarization layer (OPL) 710 and via openings is shown, according to an embodiment of the present disclosure. In this embodiment, FIG. 7B is a lateral view of the semiconductor structure 100 taken along line B-B, and FIG. 7C is a top-down view of the semiconductor structure 100.

As depicted in FIGS. 7A-7B, the OPL 710 is deposited on the semiconductor structure 100 substantially covering the first mandrels 210 and second mandrels 510. The OPL 710 can be made of any organic planarizing material that is capable of effectively preventing damage of underlying layers during subsequent etching processes. According to an embodiment, the OPL 710 allows for better depth controllability during a subsequent via patterning process. The OPL 710 can include, but is not necessarily limited to, an organic polymer including C, H, and N. According to an embodiment, the OPL material can be free of silicon (Si). According to another embodiment, the OPL material can be free of Si and fluorine (F). As defined herein, a material is free of an atomic element when the level of the atomic element in the material is at or below a trace level detectable with analytic methods available in the art. Non-limiting examples of the OPL material forming the OPL 710 can include JSR HM8006, JSR HM8014, AZ UM10M2, Shin Etsu ODL 102, or other similar commercially available materials. The OPL 710 may be deposited by, for example, spin coating followed by a planarization process, such as CMP.

With continued reference to FIGS. 7A-7C, a lithography process followed by an etching process is conducted on the semiconductor structure 100 for etching the OPL 710 and form via openings 730, as shown in the figure. In some embodiments, etching the OPL 720 can be conducted by, for example, an OPL RIE including a trace point detection. As can be observed in FIGS. 7B and 7C, the via openings 730 formed in the semiconductor structure 100 exposed selected regions or portions of the second SIT spacers 620 that will be subsequently removed, as will be described in detail below.

A location of the via openings 730 is selected based on the desired fin shape. According to embodiments of the present disclosure, by selectively removing portions of the second SIT spacers 620 the proposed combination of crosslink and single fin structure(s) can be achieved in the semiconductor structure 100.

Referring now to FIG. 8A, a cross-sectional view of the semiconductor structure 100 taken along line A-A after selectively removing portions of the second SIT spacers 620 is shown, according to an embodiment of the present disclosure. In this embodiment, FIG. 8B is a lateral view of the semiconductor structure 100 taken along line B-B, and FIG. 8C is a top-down view of the semiconductor structure 100.

In this embodiment, the via openings 730 allow to selectively remove portions of the second SIT spacers 620 that are key to achieve the crosslink configuration of the subsequently form fin structures. Since the first SIT spacers 230 and the second SIT spacers 620 are made of different materials, portions of the second SIT spacers 620 that do not satisfy design requirements (i.e., unwanted portions) can be selectively removed without damaging the first SIT spacers 230. Any suitable isotropic etch process can be conducted to remove the selected portions of the SIT spacers 620 including, for example, SC1. It should be noted that for ease of illustration the OPL 710 is not depicted in FIG. 8C.

Figure 9A:
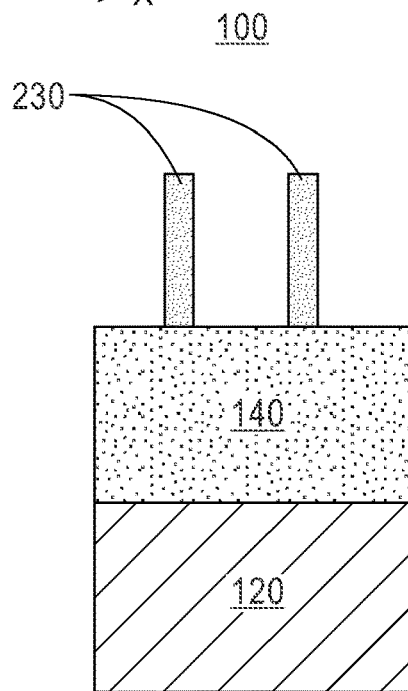
FIG. 9A is a cross-sectional view of the semiconductor structure taken along line A-A after removing the organic planarization layer, first mandrels, and second mandrels, according to an embodiment of the present disclosure.
Figure 9B:
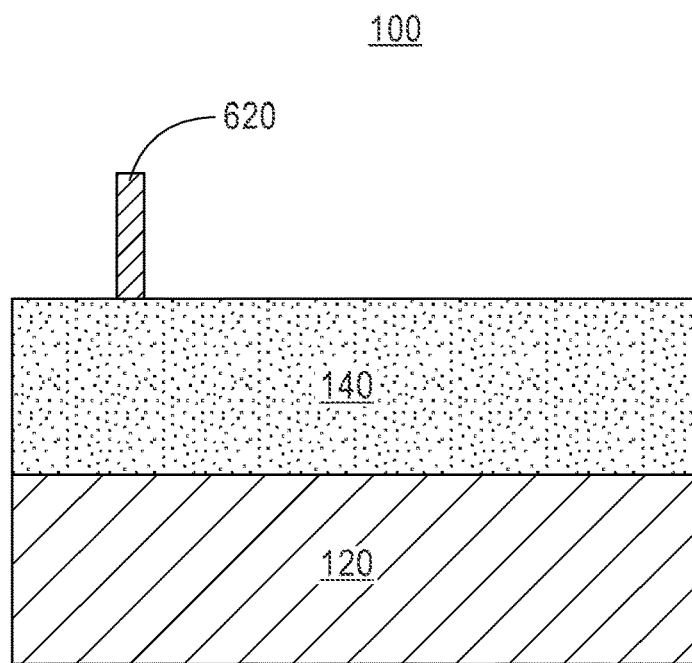
FIG. 9B is a lateral view of the semiconductor structure taken along line B-B.
Figure 9C:
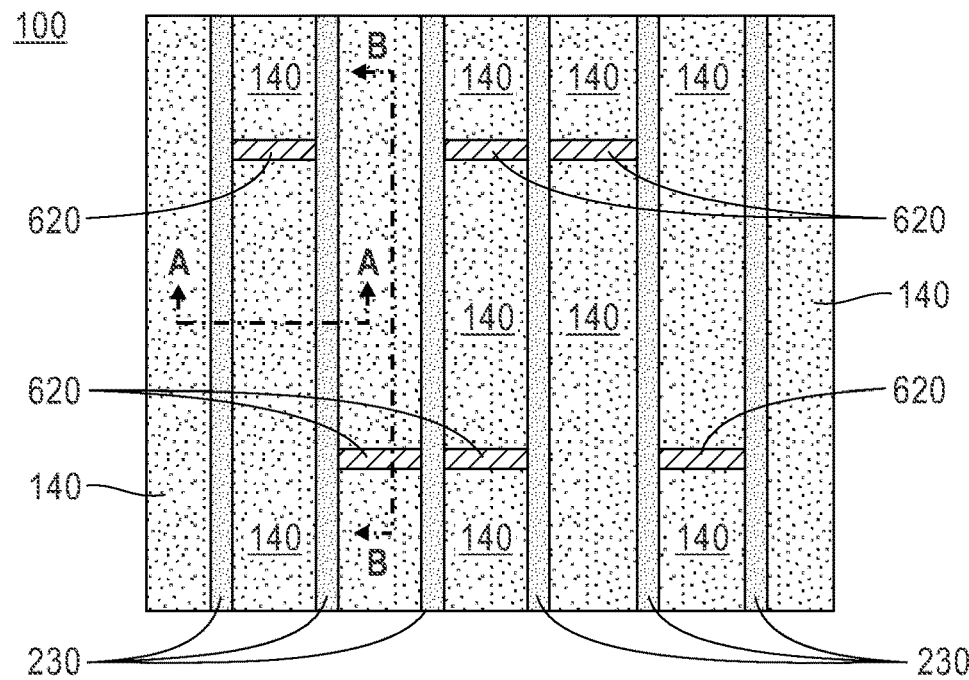
FIG. 9C is a top-down view of the semiconductor structure.

Referring now to FIG. 9A, a cross-sectional view of the semiconductor structure 100 taken along line A-A after removing the OPL 710, first mandrels 210 and second mandrels 510 is shown, according to an embodiment of the present disclosure. In this embodiment, FIG. 9B is a lateral view of the semiconductor structure 100 taken along line B-B, and FIG. 9C is a top-down view of the semiconductor structure 100.

First, the OPL 710 (FIGS. 8A-8C) is removed from the semiconductor structure 100. Exemplary techniques suitable for removing the OPL 710 (FIGS. 8A-8C) may include, but are not limited to, oxygen plasma, nitrogen plasma, hydrogen plasma or other carbon strip or ashing process, which causes minimal or no damage to the underlying layers.

Subsequently, the first mandrels 210 and second mandrels 510 are removed selective to the first SIT spacers 230 and second SIT spacers 620, as depicted in the figure. Removal of the first mandrels 210 and second mandrels 510 should not compromise the integrity of the first SIT spacers 230 and second SIT spacers 620. In an embodiment, the first mandrels 210 and second mandrels 510 may be removed using a typical standard cleaning technique, including ammonium hydroxide, hydrogen peroxide, hot ammonia, etc., in which the first SIT spacers 230 and second SIT spacers 620 are not trimmed.

According to an embodiment, the first SIT spacers 230 and second SIT spacers 620 are then used as a hard mask such that an anisotropic etching process transfers the pattern defined by the first SIT spacers 230 and second SIT spacers 620 to the underlying dielectric layer (i.e., the hardmask layer 140).

Figure 10A:
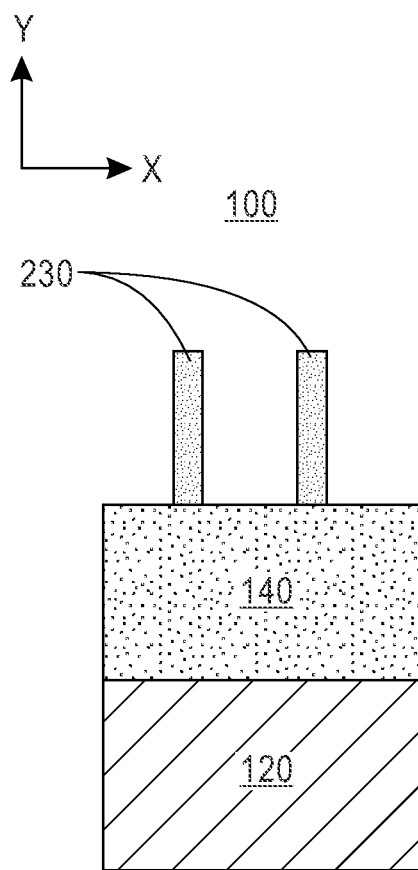
FIG. 10A is a cross-sectional view of the semiconductor structure taken along line A-A after transferring a pattern defined by the first sidewall image transfer spacers and second sidewall image transfer spacers to the hardmask layer, according to an embodiment of the present disclosure.
Figure 10B:
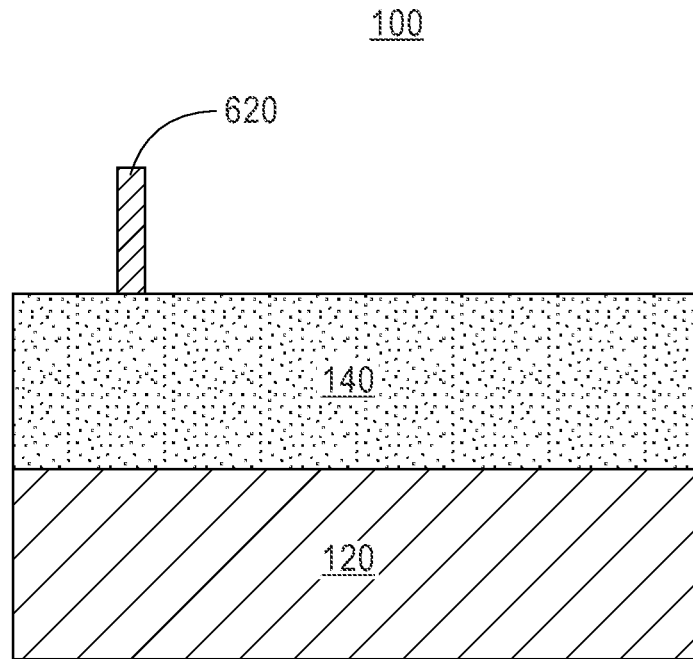
FIG. 10B is a lateral view of the semiconductor structure taken along line B-B.

Referring now to FIG. 10A, a cross-sectional view of the semiconductor structure 100 taken along line A-A after transferring the pattern defined by the first SIT spacers 230 and second SIT spacers 620 to the hardmask layer 140 is shown, according to an embodiment of the present disclosure. In this embodiment, FIG. 10B is a lateral view of the semiconductor structure 100 taken along line B-B, and FIG. 10C is a top-down view of the semiconductor structure 100.

Figure 10C:
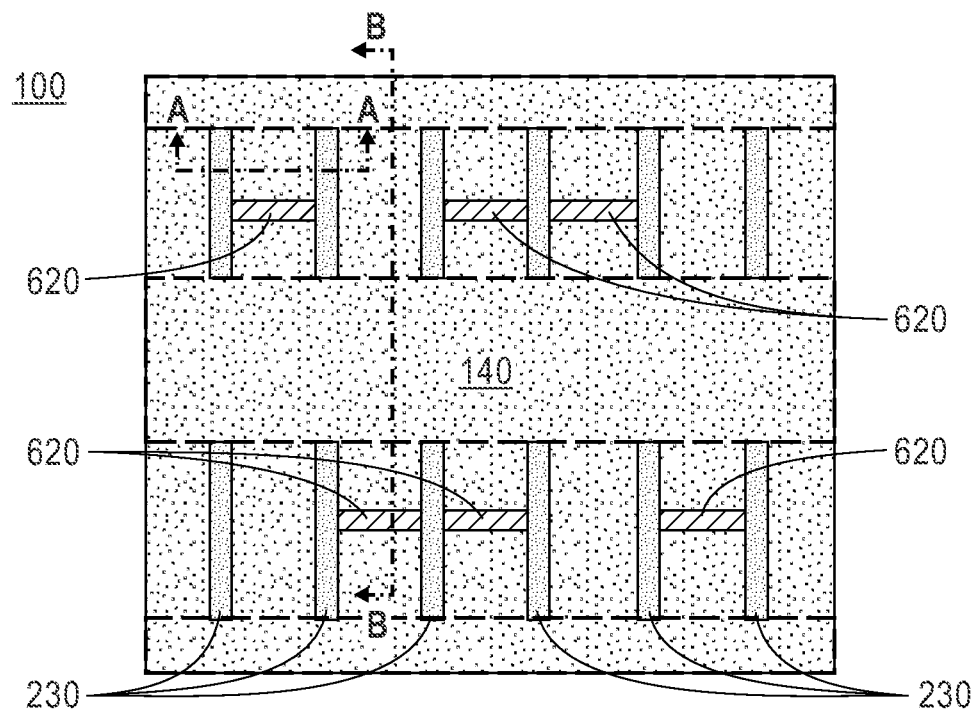
FIG. 10C is a top-down view of the semiconductor structure.

As previously described, an anisotropic etching process can be conducted on the semiconductor structure 100 to transfer the pattern defined by the first SIT spacers 230 and second SIT spacers 620 to the underlying hardmask layer 140, as illustrated in FIG. 10C. Suitable anisotropic etch processes include, for example, RIE. As may be understood, the first SIT spacers 230 and second SIT spacers 620 define the crosslink pattern that is transferred to the hardmask layer 140, and ultimately to the semiconductor substrate 120 to form the proposed combination of crosslink and single fin structures depicted in FIGS. 11A-11C. The resulting fin structures may include vertical and horizontal segments having a width that is substantially the same as the width of the first SIT spacers 230 and second SIT spacers 620. Stated differently, the first SIT spacers 230 and second SIT spacers 620 defined a width of vertical regions and horizontal regions of the fin structures.

Referring now to FIG. 11A, a cross-sectional view of the semiconductor structure 100 taken along A-A after forming a plurality of fin structures (hereinafter "fin structures") 1120 is shown, according to an embodiment of the present disclosure. In this embodiment, FIG. 11B is a lateral view of the semiconductor structure 100 taken along line B-B, and FIG. 11C is a top-down view of the semiconductor structure 100.

According to an embodiment, the patterned hardmask layer 140 is transferred into the semiconductor substrate 120 to form the fin structures 1120 via an anisotropic etching process such as, for example, RIE. A depth of the anisotropic etching process may depend on the ultimate function of the semiconductor structure 100. As can be appreciated in FIG. 11C, the resulting fin structures 1120 include a combination of crosslink and single architecture. Each of the fin structures 1120 having a crosslink configuration may include a first region extending vertically (or perpendicularly) from the semiconductor substrate 120 that is parallel to a second region of said fin structure 1120 also extending vertically from the semiconductor substrate 120, the first region and the second region of the (cros slink) fin structure 1120 are connected by a third (transversal) region of the fin structure 1120, as illustrated in FIG. 11C. The crosslink fin configuration can be repeated as desired in the semiconductor structure 100. Thus, the proposed embodiments can be applied to single fin and multiple fin devices.

It should be noted that any number of single and cros slink fin structures 1120 can be formed in the semiconductor structure 100 applicable for satisfying a specific device design. In some embodiments, two or more H-shaped fin structures 1120 can be contiguously formed in the semiconductor structure 100, as illustrated in the figures. As mentioned above, the proposed method provides a flexible device design that allows simultaneously forming a combination of single and crosslink fin structures 1120 that may improve $W_{eff}$ and reduce parasitic capacitance.

After forming the fin structure 1120, the first SIT spacers 230 and second SIT spacers 620 may now be selectively removed by means of an etching technique, which can include any suitable wet or dry etching technique. Etching of the first SIT spacers 230 and second SIT spacers 620 should not compromise the integrity of the fin structures 1120. It should be noted that for ease of illustration, the semiconductor substrate 120 is not depicted in FIG. 11C. It may be understood that a remaining portion of the hardmask layer 140 remains on top of the fin structures 1120 as depicted in the figures.

Thus, according to embodiments of the present disclosure, the final semiconductor structure 100, as depicted in FIGS. 11A-11C, may include, for example, a first fin structure 1120 above an uppermost surface of the semiconductor substrate 120 that includes a first vertical region extending perpendicular to an uppermost surface of the semiconductor substrate 120, a second vertical region extending perpendicular to the uppermost surface of the semiconductor substrate 120, the second vertical region laterally separated from the first vertical region, and a first horizontal region extending between and connecting the first vertical region and the second vertical region, and parallel to the uppermost surface of the semiconductor substrate 120.

The final semiconductor structure 100 may further include, for example, a second fin structure 1120 above the uppermost surface of the semiconductor substrate 120 that includes a third vertical region extending perpendicular to the uppermost surface of the substrate, a fourth vertical region extending perpendicular to the uppermost surface of the substrate, a fifth vertical region extending perpendicular to the uppermost surface of the substrate, the third vertical region laterally separated from the fourth vertical region, and the fourth vertical region laterally separated from the fourth vertical region, a second horizontal region extending between and connecting the third vertical region and the fourth vertical region, and parallel to the uppermost surface of the semiconductor substrate 120, and a third horizontal region extending between and connecting the fourth vertical region and the fifth vertical region, and parallel to the uppermost surface of the substrate, as illustrated in FIGS. 11A-11C. It should be noted that fin structures having any number of vertical regions connected by a horizontal region can be formed using the proposed method. This configuration can be repeated as needed for any two or more adjacent fin structures (i.e., number of fins ≤2).

The final semiconductor structure 100 may further include a third fin structure 1120 including a single fin structure, as illustrated in FIGS. 11A-11C. It should be noted that any desired number of single fins structures can be formed in combination with any desired number of crosslink fin structures using the proposed method.

As may be understood, although FIGS. 1A-11C show forming VFETs having crosslink fin structures in a specific number, orientation, location and/or combination, it is understood that any number, orientation, location and combination of crosslink fin structures, including substantially H-shaped fin structures, may be formed according to embodiments of the present disclosure.

Thus, embodiments of the present disclosure provide a fin structure including n vertical regions extending perpendicular to the uppermost surface of a semiconductor substrate and n−1 horizontal regions extending between and connecting each of the n vertical regions and parallel to the uppermost surface of the semiconductor substrate, where n>1. In embodiments in which n=1 the fin structure is a single fin structure, and in embodiments in which n>1 the fin structure is a crosslink fin structure. Any combination of fin structures can be formed in a VFET device following the above described embodiments.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. "Optional" or "optionally" means that the subsequently described event or circumstance may or may not occur, and that the description includes instances where the event occurs and instances where it does not.

Spatially relative terms, such as "inner," "outer," "beneath," "below," "lower," "above," "upper," "top," "bottom," and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" may encompass both an orientation of above and below. The device may be otherwise oriented (rotated 90 degrees or at other orientations) and the spatially relative descriptors used herein interpreted accordingly.

Approximating language, as used herein throughout the specification and claims, may be applied to modify any quantitative representation that could permissibly vary without resulting in a change in the basic function to which it is related. Accordingly, a value modified by a term or terms, such as "about", "approximately" and "substantially", are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate +/−10% of the stated value(s). As used herein, the term "substantially H-shaped" may refer to a shape having three major line segments in the shape of the letter 'H' but with some variation in the shape of the segments and/or the number of minor line segments.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of forming a semiconductor structure, comprising:
   forming a first array of mandrels on a hardmask layer disposed on an uppermost surface of a semiconductor substrate;
   forming first sidewall image transfer spacers on opposing longitudinal sidewalls of each mandrel in the first array of mandrels;
   forming a second array of mandrels on the hardmask layer, each mandrel in the second array of mandrels being laterally separated from each mandrel in the first array of mandrels by the first sidewall image transfer spacers;
   forming second sidewall image transfer spacers on opposing transversal sidewalls of the first array of mandrels and the second array of mandrels; and
   selectively removing portions of the second sidewall image transfer spacers to define a crosslink fin pattern.

2. The method of claim 1, wherein selectively removing the portions of the second sidewall image transfer spacers comprises:
   forming an organic planarization layer substantially covering the first array of mandrels, the first sidewall image transfer spacers, the second array of mandrels, and the second sidewall image transfer spacers;
   etching the organic planarization layer to form via openings on selected areas of the second sidewall image transfer spacer; and
   removing the portions of the second sidewall image transfer spacer located on the selected areas through the via openings.

3. The method of claim 1, further comprising:
   transferring the crosslink fin pattern to the hardmask layer to form a plurality of fin structures, the crosslink fin pattern including one or more vertical regions extending in a direction perpendicular to the uppermost surface of the semiconductor substrate and parallel to one another, at least two vertical regions of the one or more vertical regions being connected by a horizontal region extending between the at least two vertical regions in a direction parallel to the uppermost surface of the semiconductor substrate.

4. The method of claim 3, wherein the at least two vertical regions connected by the horizontal region defines a cross-link fin architecture in the semiconductor structure.

5. The method of claim 3, wherein at least one of the one or more vertical regions not connected by the horizontal region defines a single fin architecture.

6. A method of forming a semiconductor structure, comprising:
   patterning a plurality of fin structures on an uppermost surface of a semiconductor substrate, each fin structure of the plurality of fin structures including n first regions extending perpendicular to the uppermost surface of the semiconductor substrate and n-1 second regions extending between and connecting each of the n first regions and parallel to the uppermost surface of the semiconductor substrate, wherein n≤1.

7. The method of claim 6, wherein the plurality of fin structures on the uppermost surface of the semiconductor substrate includes one or more first regions extending in a direction perpendicular to the uppermost surface of the semiconductor substrate and parallel to one another, at least two of the one or more first regions being connected by a second region extending between the at least two of the one or more first regions in a direction parallel to the uppermost surface of the semiconductor substrate.

8. The method of claim 7, wherein the at least two first regions connected by the second region defines a crosslink fin architecture in the semiconductor structure.

9. The method of claim 7, wherein at least one of the one or more first regions not connected by the second region defines a single fin architecture.

10. The method of claim 7, further comprising:
    forming a first fin structure above the uppermost surface of the semiconductor substrate including:
    a first vertical region extending perpendicular to the uppermost surface of the semiconductor substrate;
    a second vertical region extending perpendicular to the uppermost surface of the semiconductor substrate, the second vertical region being laterally separated from the first vertical region; and
    a first horizontal region extending between and connecting the first vertical region and the second vertical region, and parallel to the uppermost surface of the semiconductor substrate.

11. The method of claim 10, further comprising:
    forming a second fin structure above the uppermost surface of the semiconductor substrate including:
    a third vertical region extending perpendicular to the uppermost surface of the semiconductor substrate;
    a fourth vertical region extending perpendicular to the uppermost surface of the semiconductor substrate;
    a fifth vertical region extending perpendicular to the uppermost surface of the semiconductor substrate, the third vertical region being laterally separated from the fourth vertical region, and the fourth vertical region being laterally separated from the fourth vertical region;
    a second horizontal region extending between and connecting the third vertical region and the fourth vertical region, and parallel to the uppermost surface of the semiconductor substrate;
    a third horizontal region extending between and connecting the fourth vertical region and the fifth vertical region, and parallel to the uppermost surface of the semiconductor substrate; and forming a third fin structure above the uppermost surface of the semiconductor substrate including only one sixth vertical region extending perpendicular to the uppermost surface of the substrate, wherein the first fin structure, the second fin structure and the third fin structure are simultaneously patterned in the semiconductor substrate.

12. A method of forming a semiconductor structure comprising:

forming a hardmask layer on an uppermost surface of a semiconductor substrate; and transferring a pattern to the hardmask layer to define a plurality of fin structures on the uppermost surface of the semiconductor substrate, the plurality of fins structures including one or more vertical regions extending in a direction perpendicular to the uppermost surface of the semiconductor substrate and parallel to one another, at least two vertical regions of the one or more vertical regions being connected by a horizontal region extending between the at least two vertical regions in a direction parallel to the uppermost surface of the semiconductor substrate.

13. The method of claim 12, wherein the two or more vertical regions connected by the horizontal region defines a crosslink fin architecture in the semiconductor structure.

14. The method of claim 12, wherein at least one of the one or more vertical regions not connected to by the horizontal region defines a single fin architecture.

15. The method of claim 12, further comprising:
forming a first array of mandrels on the hardmask layer; and
forming a second array of mandrels on the hardmask layer.

16. The method of claim 15, further comprising:
forming first sidewall image transfer spacers on opposing longitudinal sidewalls of each of the first array of mandrels and the second array of mandrels; and forming second sidewall image transfer spacers on opposing transversal sidewalls of each of the first array of mandrels and the second array of mandrels.

17. The method of claim 16, wherein the first sidewall image transfer spacers include SiCO and the second sidewall image transfer spacers include Ti.

18. The method of claim 16, further comprising:
forming an organic planarization layer substantially covering the first array of mandrels, the first sidewall image transfer spacers, the second array of mandrels, and the second sidewall image transfer spacers; and
etching the organic planarization layer to form via openings on selected areas of the second sidewall image transfer spacer.

19. The method of claim 18, further comprising:
removing portions of the second sidewall image transfer spacer located on the selected areas through the via openings.

20. The method of claim 18, further comprising:
removing the organic planarization layer.

21. The method of claim 18, further comprising:
removing the first array of mandrels and the second array of mandrels selective to the first sidewall image transfer spacers and the second sidewall image transfer spacers.

22. The method of claim 16, further comprising:
patterning the hardmask layer, wherein the patterning comprises transferring a pattern defined by the first sidewall image transfer spacers and the second sidewall image transfer spacers to the hardmask layer.

23. The method of claim 22, further comprising:
removing the first sidewall image transfer spacers and the second sidewall image transfer spacers.

24. The method of claim 22, further comprising:
using the patterned hardmask layer, etching the uppermost surface of the semiconductor substrate to form the plurality of fin structures.

25. The method of claim 22, wherein the pattern defined by the first sidewall image transfer spacers and the second sidewall image transfer spacers comprises a combination of single and crosslink fin configurations.

* * * * *